United States Patent [19]
Tults

[11] Patent Number: 5,163,164

[45] Date of Patent: Nov. 10, 1992

[54] MICROPROCESSOR CONTROLLED DIGITAL AFT UNIT

[75] Inventor: Juri Tults, Indianapolis, Ind.

[73] Assignee: Thomson Consumer Electronics, Inc., Indianapolis, Ind.

[21] Appl. No.: 635,829

[22] Filed: Dec. 31, 1990

[51] Int. Cl.[5] .............................................. H04B 1/16
[52] U.S. Cl. .................................. 455/182; 455/192.1
[58] Field of Search ............... 455/164, 165, 182, 183, 455/185, 186, 192; 358/191.1, 193.1

[56] References Cited

U.S. PATENT DOCUMENTS

| | | | |
|---|---|---|---|
| 4,031,549 | 6/1977 | Rast et al. | 358/193 |
| 4,485,404 | 11/1984 | Tults | 358/195.1 |
| 4,727,591 | 2/1988 | Manlove | 455/183 |
| 4,868,892 | 9/1989 | Tults et al. | 455/182 |

OTHER PUBLICATIONS

"Digit 2000 VLSI Digital TV System" published by the Intermetal Division of Deutsche ITT Industries, GmbH, Freiburg, Germany in 1983.
"Technical Publication 110-I²C Bus in Consumer Applications" published by Philips Export B.V., The Netherlands in 1983.

Primary Examiner—Curtis Kuntz
Attorney, Agent, or Firm—Joseph S. Tripoli; Peter M. Emanuel

[57] ABSTRACT

A tuning system of a television receiver includes a digital automatic fine tuning (AFT) unit for generating a digital AFT signal representing the deviation of the frequency of the picture carrier of the IF signal from a nominal frequency value. The digital AFT unit includes a counter for counting cycles of picture carrier during counting intervals. A portion of the IF section, the counter and at least of a portion of the signal processing section of the television receiver are included within a single integrated circuit. A microprocessor is coupled to the integrated circuit through a serial data bus. Under software program control, the microprocessor (1) transmits function control and counting control information to the signal processing section through the serial data bus, (2) receives count information from the counter through the serial data bus, and (3) evaluates count information to determine the deviation of the frequency of the IF picture carrier from its nominal frequency value.

4 Claims, 4 Drawing Sheets

MICROPROCESSOR CONTROLLED DIGITAL AFT UNIT

FIELD OF THE INVENTION

The present invention relates to a digital apparatus for measuring the frequency of an intermediate frequency (IF) signal such as is produced in a television receiver.

BACKGROUND OF THE INVENTION

In a television receiver, RF signals provided by an RF source are received by an RF amplifier. The RF amplifier selects the RF signal corresponding to the channel selected by a user. The selected RF signal is coupled to a mixer where it is mixed with a local oscillator (LO) signal having a frequency corresponding to the selected channel to produce an intermediate frequency (IF) signal. The frequency of the LO signal is controlled so that the frequency of the picture carrier of the IF signal is at a nominal value, e.g., 45.75 MHz in the United States.

It is known to control the LO frequency using two tuning arrangements: a first for establishing the frequency of the LO signal at the nominal value for a selected channel; and a second for changing the frequency of the LO signal from the nominal value, e.g., to account for frequency offsets of the RF for the selected channel signal from its standard value. The frequency of the RF signal may be offset from its standard value, defined by broadcast specifications, when the RF signal source is other than a broadcast transmitter, such as a cable distribution network or video accessory like a video cassette recorder (VCR) or video disk player. The first arrangement may have a closed loop or frequency synthesis configuration, e.g., including a phase locked loop (PLL) or a frequency locked loop (FLL), or an open loop or voltage synthesis configuration, e.g., including a digital-to-analog converter. The second arrangement typically includes an automatic fine tuning (AFT) unit for generating an AFT signal representing the deviation of the frequency of IF picture carrier from its nominal value.

Usually the circuitry for generating an AFT signal is "analog" circuitry and includes a filter, often referred to as the "AFT tank", for generating an analog AFT signal having a level with a polarity and a magnitude which represent the sense and the magnitude of the deviation of the frequency of the IF picture carrier from its nominal value. In some tuning systems such as the one disclosed in U.S. Pat. No. 4,031,549, entitled "Television Tuning System with Provisions for Receiving RF Carrier at Nonstandard Frequency", issued to Rast, Henderson and Wine on Jul. 21, 1977, the analog AFT signal is used to directly control the LO frequency. In other tuning systems, such as disclosed in U.S. Pat. No. 4,868,892, entitled "Tuning System for Calculating the Local Oscillator Frequency from an AFT Characteristic", issued to Tults, Testin and Rumreich on Sep. 19, 1989, the analog AFT signal is converted to a digital signal (usually consisting of two bits) which is used to control a phase locked loop and thereby the LO frequency.

It is desirable to provide a "digital" AFT unit since the AFT tank circuit associated with an "analog" AFT unit requires components which cannot readily be incorporated in an integrated circuit (IC) and which may require alignment. In addition, a digital AFT unit is more compatible with a digital tuning control unit since interface circuitry for converting an analog AFT signal to a digital AFT signal is not required.

U.S. Pat. No. 4,485,404, entitled "Digital AFT which is Activated During the Vertical Retrace Intervals", issued to Tults on Nov. 27, 1984 discloses a tuning system in which a counting arrangement is used to measure the frequency of the IF picture carrier to produce a digital AFT signal. The counting arrangement is enabled to count cycles of the IF picture carrier during a measurement interval. The count accumulated during the measurement interval is evaluated to determine the frequency of the IF picture carrier.

While digital AFT units of the type described in the Tults patent do not require analog circuitry such as the AFT tank, the logic circuitry forming the digital AFT unit may be complex. It is desirable therefore to provide a digital AFT unit which is relatively simple in construction.

SUMMARY OF THE INVENTION

The present invention resides in part on the recognition that a control system for a television receiver, including a microprocessor (also referred to as a microcomputer or micro-controller) and a serial data bus, for generating and distributing digital control signals for various sections of the television receiver, may also be used as an integral part of a digital AFT unit including a counter to control the counter and to evaluate the counts accumulated by the counter during a measurement period in order to evaluate the frequency of the IF picture carrier. More specifically, a preferred embodiment of the invention includes a microprocessor, a bi-directional serial data bus, and a counter. The counter is incorporated within an integrated circuit (IC) including at least a portion of the IF section of the television receiver, and preferably other sections, such as the luminance and chrominance signal processing sections. The microprocessor generates digital control words for controlling various functions of the IC. The digital function control words are transmitted to the IC via the serial data bus. In addition, the microprocessor generates a digital control word for enabling the counter to count cycles of the IF picture carrier during a measurement period. The digital count enabling word is also transmitted to the IC via the serial data bus. At a prescribed time after the generation and transmission of the count enabling signal, preferably automatically determined by the execution of instructions required for the generation and transmission of the count enabling signal, the contents of the counter are "read" also using the serial data bus and evaluated by the microprocessor to determine the frequency deviation of the IF picture carrier.

These and other aspects of the invention will be described with reference to the accompanying Drawings.

BRIEF DESCRIPTION OF THE DRAWINGS

For a better understanding of the present invention, reference should be made to the accompanying Drawings, in which.

In the various Figures, the same or similar elements and signals are identified in the same manner.

DETAILED DESCRIPTION OF THE DRAWINGS

Figure 1:
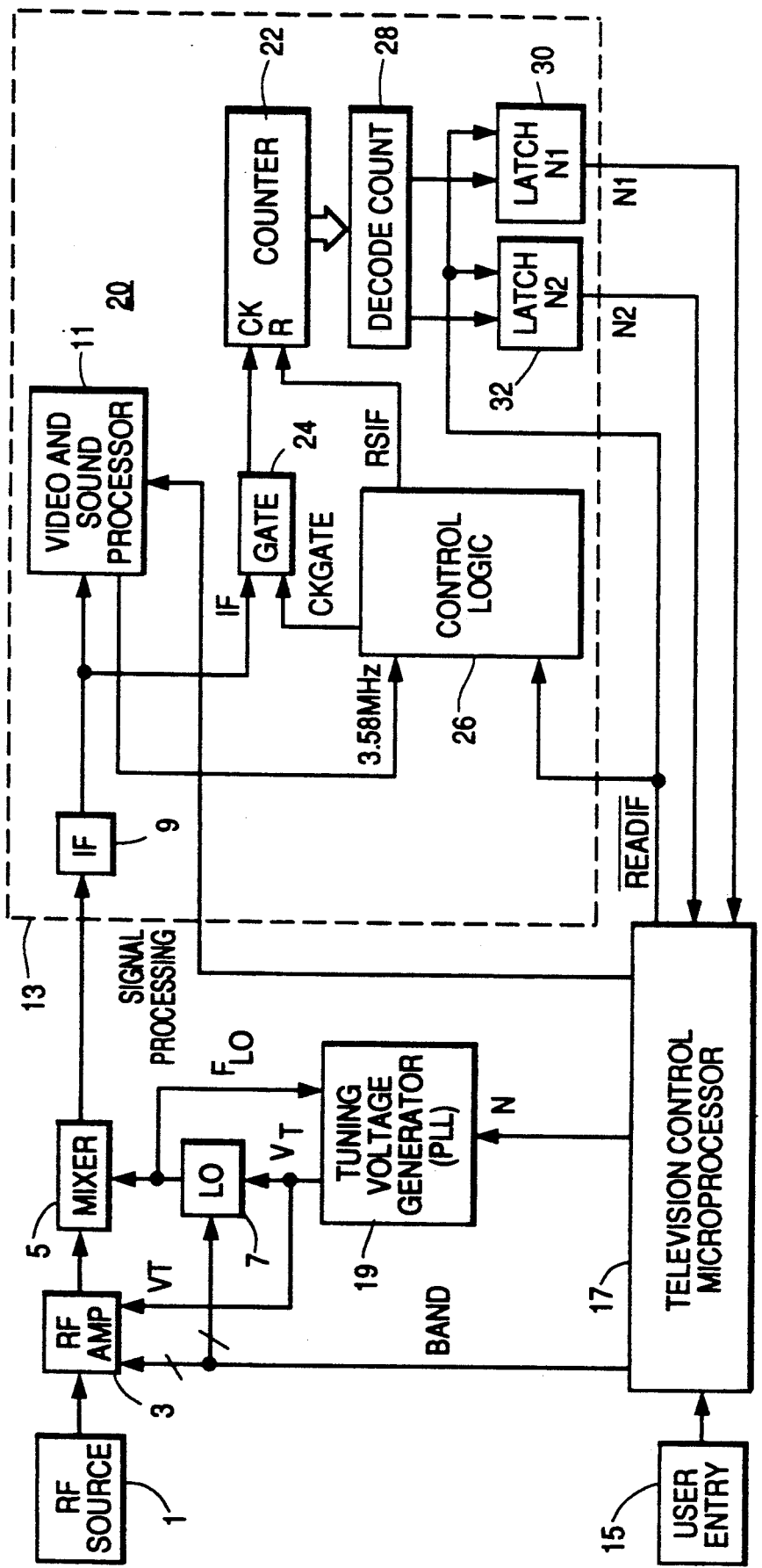
FIG. 1 shows, in block diagram form, a tuning system of a television receiver including a digital AFT unit including a counting arrangement for counting cycles of the IF picture carrier in order to generate a digital AFT signal.

Referring to FIG. 1, a RF source 1 provides a plurality of RF television signals corresponding to respective channels. An RF television signal includes modulated picture, color and sound carriers. The RF signals supplied by RF source 1 are coupled to an RF amplifier 3 which is tuned in response to a tuning voltage ($V_T$) to select one of the RF signals corresponding to a channel selected by a user. The selected RF signal is coupled to a mixer 5. Mixer 5 also receives a local oscillator (LO) signal generated by a LO 7. LO 7 is also responsive to the tuning voltage to control the frequency of the LO signal in accordance with the selected channel. Mixer 5 heterodynes the RF signal selected by RF amplifier 3 with the LO signal generated by LO 7 to produce an IF signal including modulated picture, color and sound carriers corresponding to those of the selected RF signal. In the United States the picture carrier has a nominal frequency of 45.75 MHz, the color carrier has a nominal frequency of 42.17 MHz and the sound carrier has a nominal frequency of 41.25 MHz.

The IF signal generated by mixer 5 is coupled to an IF section 9 which filters and amplifies the received IF signal. The filtered and amplified IF signal is coupled to a video and audio signal processing section 11. Processing section 11 demodulates the filtered and amplified IF signal to produce a baseband video signal including luminance, chrominance and synchronizing components. The video information is organized in sequential fields including line intervals including picture information and horizontal and vertical retrace blanking intervals including synchronization information. Processing section 11 processes the luminance, chrominance and synchronization components to form image representative color signals suitable for reproducing an image. Processing section 11 also extracts the sound information from the IF signal to produce an audio signal suitable for reproducing sound. Among other functions, processing section 11 may control the brightness, contrast and sharpness of the reproduced image and the volume of the reproduced sound.

Significant portions of IF section 9 and signal processing section 11 are incorporated in one or more integrated circuits (ICs). In the illustrated embodiment, these portions are incorporated in a single IC symbolically represented by dashedline rectangle 13. Such ICs are well known and are sometimes referred to as "jungle" ICs or "one-chip" ICs.

A user enters commands for selecting the channel to be received and for controlling various signal processing functions such as image brightness, contrast and sharpness and sound volume using a command entry unit 15 including a keypad (not shown) mounted on either a remote control transmitter (not shown) or directly on the housing of the television receiver itself. A television control unit 17 comprising a microprocessor, operating in accordance with a stored software program, is responsive to command signals produced by command entry unit 15 to generate appropriate control signals for various sections of the television receiver. More specifically, control microprocessor 17 generates band selection control signals for controlling the configuration of RF amplifier 3 and LO 7 according to the frequency band of the selected channels and a digital word representing a number N which is used to generate a tuning voltage (VT) for RF amplifier 3 and LO7. Control microprocessor 17 also generates a plurality of signal processing control signals for controlling various functions of video and audio signal processing section 11.

In the exemplary embodiment, the tuning voltage ($V_T$) is generated by a phase locked loop (PLL) 19 which controls the frequency of the LO signal so that it is proportional to a reference frequency signal derived from the output signal of a crystal oscillator (not shown) by the number N. Specifically, the number N determines the division ratio of a programmable frequency divider included in the PLL in the manner described in greater detail in U.S. Pat. No. 4,868,892 issued to Tults, Testin and Rumreich referred to above. In addition to the channel number of the selected channel, the number N is also controlled in response to an AFT signal representing the deviation of the frequency of the IF picture carrier from its nominal value, e.g., 45.75 MHz in the United States, so as to compensate for any deviation of the frequency of the RF signal for the selected channel from it standard (broadcast) value. The frequency of the RF signal may be offset from its standard value when RF source 1 comprises a cable distribution network or video accessory, such as a VCR or video disk player. The manner in which this frequency correction is accomplished is also described in more detail in the Tults, et al. U.S. patent.

The portion of the television receiver described so far is conventional. The remaining portion of the tuning system concerns a digital AFT unit 20 with which the present invention is primarily concerned.

Digital AFT unit 20 measures the frequency of the IF picture carrier by counting the number of cycles of the IF picture carrier during measuring intervals or "windows" having a predetermined duration. The IF picture carrier is amplitude modulated by picture information during line intervals and other, mainly synchronizing, information during horizontal and vertical retrace blanking intervals. The picture carrier may be overmodulated with picture information resulting in unreliable counting of its cycles. Therefore, it was proposed in U.S. Pat. No. 4,485,404 issued to Tults referred to above, that the cycles of the IF picture carrier be counted only during the vertical blanking interval (VBI), where the carrier is not over-modulated. However, it may be difficult to determine when the VBI occurs if the VBI is not of normal form because, e.g., the television signal is scrambled, or modified to hamper tape copying, or weak.

In digital AFT unit 20, the windows in which counting of the IF picture carrier cycles takes place are distributed throughout a measuring period of at least one field period of the television signal, e.g., 16.7 milliseconds (ms) in the United States. Although there is a random phase relationship between the windows and the VBI, the duration and spacing of the windows is chosen so that at least one window falls within the VBI during each measurement period. The counting intervals or windows are defined by pulses of a stable timing signal. For example, as is indicated in FIG. 1, the timing signal may be derived from the 3.58 MHz color subcarrier oscillator (not shown) included within video and audio signal processing unit 11. By way of example, with respect to digital AFT unit 20 shown in FIG. 1, by choosing windows having a duration of 35.76 microseconds ($\mu$s) and spaced by the same amount, the IF picture carrier is sampled about 230 times per 16.7 ms measuring period. Therefore, it is assured that at least some of the windows are within the VBI where the picture carrier is not over-modulated and therefore can be reliably counted.

The closet frequency to the nominal IF picture carrier frequency of 45.75 MHz which has an integral number of cycles within a 35.76 $\mu$s window is 45.751 MHz (i.e., a frequency having a deviation of 1 KHz). Ideally, e.g., for an IF picture carrier frequency of 45.751 MHz and a window of 35.76 $\mu$s duration, the count per window should be 1636 cycles. However, the phase relationship of the windows and the IF picture carrier is random, so that the count will vary from window to window. This also applies to other IF picture carrier frequencies. In addition, a particular count can be produced for a range of IF picture carrier frequencies. The probability that a particular count will occur for different IF picture carrier frequencies is indicated by the graph shown in FIG. 2. In the graph, the IF picture carrier frequency is indicated by the deviation ($\Delta$IF) from an IF picture carrier frequency of 45.751 MHz.

The counts produced in the windows spread over the field period may be affected by over-modulation of the picture carrier or other causes of dropouts resulting in counts which are too low (rather than too high). In addition, noise manifests itself as signal components having frequencies near the center of the IF passband, e.g., at about 43 MHz, and therefore results in low counts. Consequently, low counts are ignored.

Figure 2:
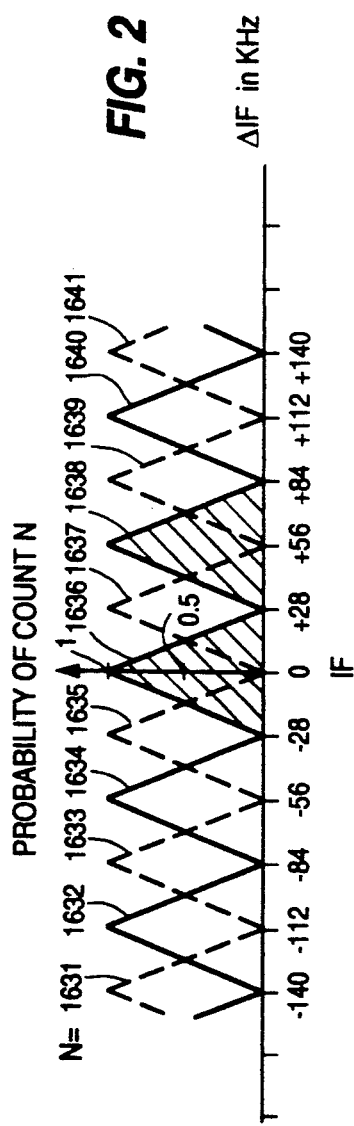
FIG. 2 shows a graph illustrating the relationship between probability of the occurrence of various counts (N) of the cycles of the IF picture carrier produced by the counting arrangement of the digital AFT unit shown in FIG. 1 as a function of the deviation of IF picture carrier frequency from a nominal value.

By examining the graph shown in FIG. 2, it will be appreciated that by detecting only two count conditions, N1 $\geq$ 1636 associated with a range of frequencies surrounding the nominal picture carrier frequency of 45.751 MHz and N2 $\geq$ 1638 associated with the higher adjacent range of frequencies, it can be determined whether the IF picture carrier frequency is low, high, or within specified limits as indicated in the following table. In the table a "1" indicates the presence of a count and a "0" indicates absence of a count.

TABLE 1

| N1 $\geq$ 1636 | N2 $\geq$ 1638 | $\Delta$IF (KHZ) | IF (MHz) |
|---|---|---|---|
| 0 | 0 | < $-$28 | LOW <br> <45.723 |
| 1 | 0 | $-$28 < $\Delta$IF < +28 | WITHIN LIMITS <br> 45.723 < IF < 45.779 |
| 1 | 1 | > +28 | HIGH <br> >45.779 |

With these underlying principals in mind, digital AFT 20 shown in FIG. 1 will be described in detail.

Referring again to FIG. 1, an IF signal derived from the final IF amplifier of IF section 9 and suitably limited to form a signal compatible with logic devices is coupled to a gate 24. Gate 24 is selectively caused to couple the IF signal to a counter 22 in response to pulses of a CKGATE signal generated by a control logic unit 26 when enabled by the low level of a $\overline{\text{READIF}}$ signal. The low level of the $\overline{\text{READIF}}$ signal has a duration of 16.7 ms and is generated by television control microprocessor 17 when it is desired to measure the IF picture carrier frequency. The CKGATE signal defines the counting intervals or "windows" distributed throughout the 16.7 ms measuring period.

The cycles of the IF signal passed by gate 24 within each window are counted by counter 22. Counter 22 responds to the IF picture carrier and not to the other components of the IF signal because the IF picture carrier is the dominant component of the IF signal. Counter 22 is reset in response to a RESIF signal generated by control logic unit 26 immediately before each window occurs. Selected outputs of the stages of counter 22 which uniquely indicate the presence of the counts N1 and N2 are coupled to a count decoding logic unit 28 which produces single bits indicating the presence ("1") or absence ("0") of the respective counts N1 and N2. The bits indicating the counts N1 and N2 are stored in latches 30 and 32, respectively. Latches 30 and 32 are held reset before the beginning of the 16.7 ms measuring period in response to the high level of the $\overline{\text{READIF}}$ signal, but are not reset again during the measurement period.

The contents of latches 30 and 32 are read after the end of the 16.7 ms measuring period and interpreted according to Table 1 by television control microprocessor 17 in order to determine whether the IF picture carrier frequency is low, high or withing specified limits. Based on the determination, control microprocessor 17 controls the number N associated with PLL 19 and thereby the LO frequency in the manner disclosed in U.S. Pat. No. 4,485,404 referred to above. Provide the LO frequency is adjusted in steps of less than 56 KHz (the frequency range covered by one probability peak indicated in FIG. 2) a substantially correct and stable tuning condition is achievable. For example, the LO frequency may be adjusted in steps of 31.25 KHz.

Specifically, after reading N1 and N2, television control microprocessor 17 will act as follows:

1. If N1=1 and N2=1, then the IF frequency is too high and the LO frequency is decreased, e.g. by 31.25 KHz.
2. If N1=1 and N2=0, then the IF frequency is within specified limits and the LO frequency is left unchanged.
3. IF N1=0 and N2=0, then the IF frequency is too low and the LO frequency is increased, e.g., by 31.25 KHz.

Details of logic circuitry implementing digital AFT unit 20 shown in block diagram form in FIG. 1 may be found in concurrently filed U.S. patent application Ser. No. 635,843 entitled "Digital Method and Apparatus for Measuring the Frequency of an IF Signal" having the same inventor, Tults, as the present invention.

Figure 3:
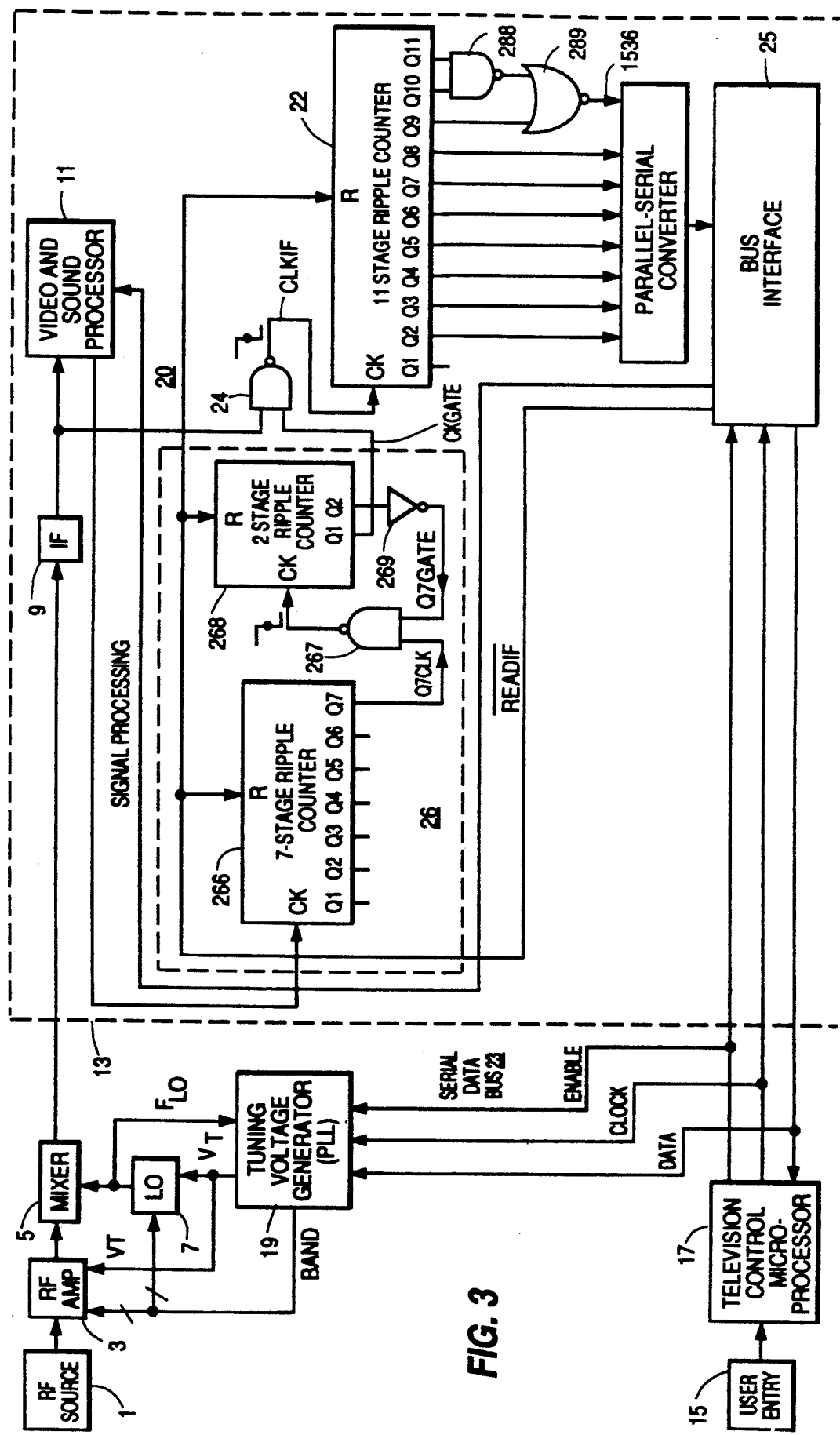
FIG. 3 shows, partially in block diagram form and partially in logic diagram form, a digital AFT unit constructed in accordance with an aspect of the invention.

Digital AFT unit 20 shown in FIG. 1 operates quite satisfactorily. However, it requires discrete logic elements associated with count decoder 28 and latches 30 and 32. Digital AFT unit 20 shown in FIG. 3 allows those logic elements to be eliminated or at least significantly simplified. Specifically, as is indicated in FIG. 3, television control microprocessor 17 and a serial data bus 23, which are utilized to control various portions of the television receiver, are also used as integral parts of digital AFT unit 20. In FIG. 3, various elements which were previously discussed with reference to FIG. 1 are identified in the same manner.

More specifically, in the television receiver shown in FIG. 1 various signals coupled between television control microprocessor 17 and video and audio signal processing section 17, tuning voltage generator 19 and digital AFT unit 20 were coupled via separate conductors. In the television receiver shown in FIG. 3, the information contained in these signals is digitally transmitted between television control unit 17 and processing section 11, tuning voltage generator 19 and digital AFT unit 20 via serial data bus 23. A bus interface unit 25 is included within IC 13 for decoding the data received from television control microprocessor 17 to produce control signals for signal processing section 11 and digital AFT unit 20. A similar bus interface unit (not shown) is included in tuning voltage generator 19 for decoding the data received from television control microprocessor 17 to produce control signals for controlling the division factor N of the PLL and also to generate the band selection signals for RF amplifier 3 and LO 7.

Figure 5:
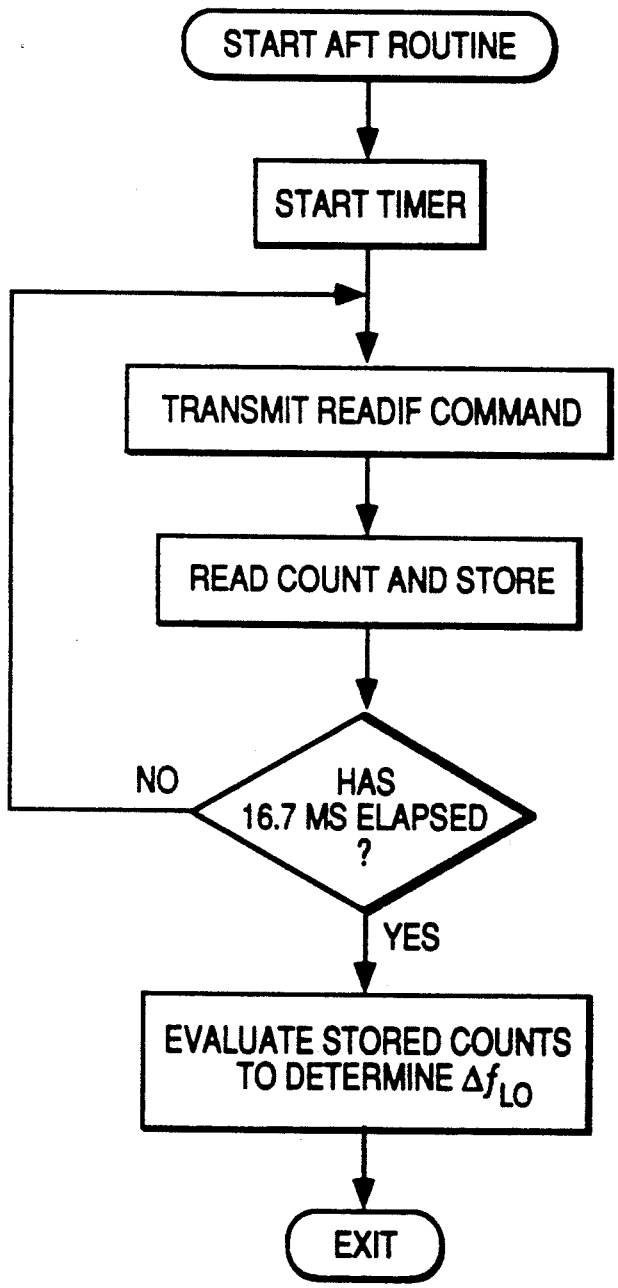
FIG. 5 shows a flow chart of a software program utilized in connection with the digital AFT unit shown in FIG. 3.

By way of example, serial data bus 23 may be of the type employed in television receivers manufactured by Thomson Consumer Electronics of France and illustrated in FIGS. 5 and 6. Serial data bus 23 may also be of the well known IM (INTERMETALL) type developed by ITT INTERMETALL Semiconductors of Germany described in the ITT publication "Digit 2000 VLSI Digital TV System" or of the also well known I²C (Inter IC) type developed by Philips of The Netherlands and described in Philips Technical Publication 110-"I²C Bus In Consumer Electronics".

Figure 4:
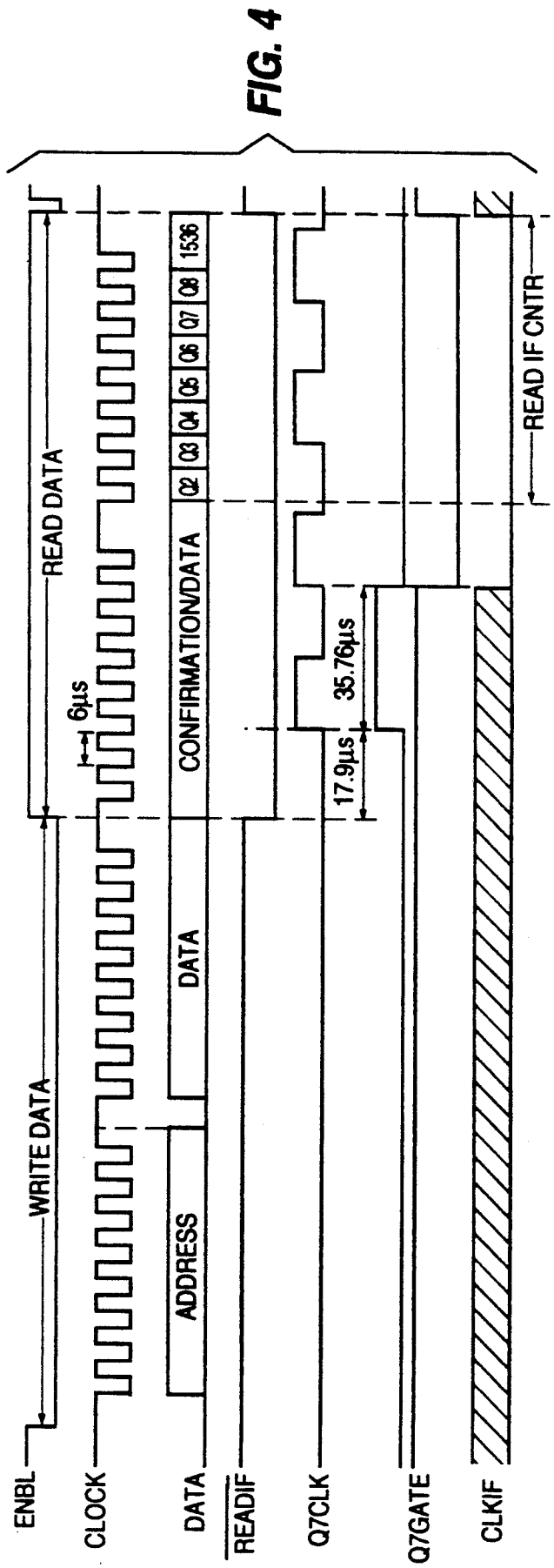
FIG. 4 shows waveforms of signals generated during the operation of the digital AFT unit shown in FIG. 3.

Briefly, as is indicated in FIG. 3, serial bus 23 includes three conductors: one for a DATA signal; one for a CLOCK signal; and one for an ENABLE signal. The waveforms for these three signals are illustrated in FIG. 4. Data bus 23 is "bi-directional", i.e., data can be coupled in both directions between a "master" unit, usually including a microprocessor such as television control microprocessor 17, and a "slave" unit including a bus interface unit such as bus interface unit 25. The data is synchronously transmitted with respect to clock pulses of the CLOCK signal. The CLOCK signal is generated by control microprocessor 17 and is used by bus interface unit 25 to decode the DATA signal. The ENABLE signal is also generated by control microprocessor 17 and initiates the communication process between control microprocessor 17 and bus interface unit 25.

A first, i.e., low level, portion of the ENABLE signal is used to transmit or "write" data from the master unit to the slave unit. During a first interval of the "write" portion, an "address" word of 8 bits indicating the function to be controlled is transmitted. During a second interval of the "write" portion, a data word of 8 bits representing a particular aspect of the function to be controlled may be transmitted. In digital AFT unit 20 shown in FIG. 3, the "address" word is used to transmit a READIF command for causing bus interface unit 25 to generate the low level of the $\overline{\text{READIF}}$ signal as indicated in FIG. 4. A second, i.e., high level, portion of the ENABLE signal is used to transmit or "read" data from the slave unit to the master unit. Two data words, e.g., of 8 bits each, may be transmitted during the "read" portion of the ENABLE signal. The first data word must include a confirmation of the receipt of the "address" word transmitted from the master unit and may comprise a portion of the "address" word. In digital AFT unit 20 shown in FIG. 3, the second data word is used to transmit the data representing the count of counter 22 television control microprocessor 17. To accomplish this, the contents of counter 22 are coupled to a parallel-to-serial converter 27 which converts the bits representing the count to a serial bit stream which is coupled to control microprocessor 17 via serial data bus 23.

The contents of counter 22 are partially decoded by a logic arrangement including NAND gate 288 and NOR gate 289 to produce a signal indicative of a count of 1536. Only the Q2–Q8 outputs of counter 22 and the 1536 count indication, consisting of a total of 8 bits compared to the 12 output bits of counter 22, are coupled to control microprocessor 17. The reduction of the number of bits in the count representative digital word permits the use of only one 8-bit data word for the transmission of count information via serial data bus 23.

The flowchart for the portion of the program associated with the digital AFT unit shown in FIG. 5 is shown in FIG. 3. As indicated in FIG. 5, after the AFT subroutine is initiated, a "timer" for measuring elapsed time is started and the READIF command is caused to be transmitted. The resulting low level of the $\overline{\text{READIF}}$ signal enables control logic unit 26 to generate the CKGATE signal which establishes a 35.76 µs counting window. In the implementation shown in FIG. 3, control logic unit 26 includes a 7-stage ripple counter 266, a NAND gate 267, a 2-stage ripple counter 268 and an inverter 269. The waveforms for a Q7 CLK signal and a Q7 GATE signal generated within control logic unit 26 are shown in FIG. 4. The high level of the CKGATE enables a NAND gate, serving as gate 24, to couple the IF signal to counter 22 as is indicated by the cross-hatched portion of the signal CLKIF.

After the termination of the 35.76 µs counting window, i.e., when the CKGATE signal returns to the low level, television control microprocessor 17, under software control, examines contents of counter 22 to determine whether the count represented by the 11 bits is equal to or larger than 1636 or 1638 and memorizes the result. The examination can take place any time after 53.66 µs (17.9 µs + 35.76 µs) has elapsed after the negative transition of the $\overline{\text{READIF}}$ signal as indicated in FIG. 4. This time is "known" by control microprocessor 17 since clock pulses of the CLOCK signal, which synchronize the communication between control microprocessor 17 and digital AFT unit 20 are generated by control microprocessor 17 and are therefore related to its instruction cycles. As indicated in FIG. 5, this sequence is repeated over a time period of at least 16.7 ms. Since the communication between control microprocessor 17 and bus interface unit 23 requires slightly more than 256 µs (i.e., 4 words × 8 bits/word × 8 µs/bit) and the VBI includes at least 9 lines having a total duration of 571.5 µs (9 lines × 63.5 µs), it is possible to ensure that at least one counting interval occurs during the VBI if the process is repeated, e.g., every 500 µs.

At the end of 16.7 ms measurement period, if one or more of the count samples obtained during the 16.7 ms measurement period was 1638 or greater, then the LO frequency is decreased by decreasing N. If none of the count samples was equal to or greater than 1636 then the LO frequency is increased. If one or more of the count samples was equal to or greater than 1636 but none was equal or greater than 1638, the LO frequency is left unchanged.

It is noted, for comparison, that in digital AFT unit 20 shown in FIG. 1, the low level of the $\overline{\text{READIF}}$ signal corresponds to the entire 16.7 ms measurement period including a plurality of 35.76 μs counting windows separated by 35.76 μs. However, in digital AFT unit 20 shown in FIG. 3, the low level of the $\overline{\text{READIF}}$ signal determines the duration of one measurement interval including one 35.76 μs counting window within the 16.7 ms measurement period. While in digital AFT unit 20 shown in FIG. 3, the counting windows are separated by at least the time required for transmission via serial data bus 23 (rather than 35.76 μs as in digital AFT unit 20 shown in FIG. 1), for the reasons indicated above, the evaluation of the IF picture carrier frequency has been found to be extremely reliable.

It will be understood that the present invention has been described with reference to a preferred embodiment by way of example and that modifications will occur to those skilled in the art.

For example, although a phase locked loop (PLL) is employed in the embodiment shown in FIG. 1 to generate the tuning voltage, a frequency locked loop (FLL), such as disclosed in U.S. Pat. No. 4,485,404 issued to Tults referred to above, may also be employed. For that matter, an opened loop voltage synthesis arrangement utilizing a digital-to-analog converter for converting a digital word to a DC level may be employed.

In addition, the frequency of the IF signal may be divided by a frequency divider (known as a "prescaler") before being coupled to digital AFT unit 20.

Further, while the IF signal coupled to digital AFT unit 20 was said to be derived from the final IF amplifier of IF section 9, it may be derived in other ways. For example, the IF signal may be derived from the tuned circuit (not shown) of the synchronous video detector (not shown) included with video and audio signal processing section 11. Advantageously, the pulse signal produced at this point due to the limiting devices (e.g., diodes) may be compatible with the logic devices of the digital AFT unit 20.

Still further, while it was indicated with reference to the software program depicted in FIG. 5 that the actual count after each counting cycle is stored, it is also possible to store only indications that the counts N1 and N2 were produced. In that case, after the 16.7 ms measurement period has elapsed, it is only necessary to determine which ones, if any, of the N1 and N2 count indications have been stored. Furthermore, with respect to the software program indicated in FIG. 7, it is possible to terminate the routine once both of the counts N1 and N2 have been produced and immediately proceed to the desired LO frequency adjustment.

Even further, portions of digital AFT unit 20, such as counter 22, may be de-energized at times other than during the measurement period in order to save energy. This is especially important when integrated circuit 13 includes bi-polar devices since in this case counter 22 will consume power even when it is not counting. With respect to such an energy-saving provision a delay should be provided between the beginning of the measurement period (corresponding to the negative transition of the $\overline{\text{READIF}}$ signal) and the beginning of the counting interval (corresponding to the positive transition of the CKGATE signal) to allow sufficient time for the de-energized portions of digital AFT unit 20 to be energized. The 17.9 μs delay of the CKGATE signal illustrated in FIG. 4 has that purpose.

These and other modifications are intended to be within the scope of the invention defined by the following claims.

I claim:

1. Apparatus comprising:
    means for tuning a radio frequency (RF) signal having a modulated carrier to produce an intermediate frequency (IF) signal having a modulated carrier corresponding to said modulated carrier of said RF signal and having a nominal frequency value;
    means for demodulating said IF signal to produce a response signal;
    means for processing said response signal in accordance with function control information;
    means for counting cycles of said modulated carrier of said IF signal during a measurement period determined by counting control information to produce count information indicative of the frequency of said information bearing carrier of said IF signal;
    a serial data bus coupled to said response signal processing means and to said counting means; and
    means operating under software program control for (1) transmitting said function control information to said response signal processing means through said serial data bus and for transmitting said counting control information to said counting means through said serial data bus, (2) receiving said count information from said counting means through said serial data bus, and (3) evaluating said count information to determine the frequency deviation of said modulated carrier of said IF signal from said nominal frequency value.

2. The apparatus defined in claim 1 wherein:
    said processing means comprises means for amplifying said IF signal; and
    at least said amplifying means and said counting means are included within an integrated circuit.

3. Apparatus comprising:
    means for providing a radio frequency (RF) signal having a modulated carrier; means for generating a local oscillator (LO) signal corresponding to a selected channel; means for combining said RF signal and said LO signal to produce an intermediate frequency (IF) signal having a modulated carrier corresponding to said modulated carrier of said RF signal and having a nominal frequency value;
    means for amplifying said IF signal;
    means for demodulating said IF signal to produce a response signal;
    means for processing said response signal in accordance with function control information;
    means for counting cycles of said modulated carrier of said IF signal during a measurement period determined by counting control information to produce count information indicative of the frequency of said information bearing carrier of said IF signal;
    a serial data bus coupled to said response signal processing means and to said counting means; and
    means operating under software program control for (1) transmitting said function control information to said processing means and said counting control information to said counting means through said serial data bus, (2) receiving said count information from said counting means through said serial data bus, and (3) evaluating said count information to determine the frequency deviation of said modulated carrier of said IF signal from said nominal frequency value wherein:

said counting means produces a digital word representing said count information;

said data bus is capable of transmitting a predetermined number of bits per data word; and means are included for at least partially decoding said digital word representing said count information to produce another digital word representing said count information and containing no more than said predetermined number of bits.

4. Apparatus comprising:

means for tuning a radio frequency (RF) signal having a modulated carrier to produce an intermediate frequency (IF) signal having a modulated carrier corresponding to said modulated carrier of said RF signal and having a nominal frequency value;

means for demodulating said IF signal to produce a response signal;

means for processing said response signal in accordance with function control information;

means for counting cycles of said modulated carrier of said IF signal during a measurement period determined by counting control information to produce count information indicative of the frequency of said information bearing carrier of said IF signal;

a serial data bus coupled to said response signal processing means and to said counting means for communicating information in a format comprising a write data interval and a read data interval; and means operating under software program control for (1) transmitting said function control information to said response signal processing means through said serial data bus and for transmitting said counting control information to said counting means through said serial data bus during said write data interval, (2) receiving through said serial data bus during a latter portion of said read data interval said count information produced during said measurement period which occurs within an initial portion of said read data interval, and (3) evaluating said count information to determine the frequency deviation of said modulated carrier of said IF signal from said nominal frequency value.

* * * * *